(12) United States Patent
Okamoto et al.

(10) Patent No.: US 10,163,925 B2
(45) Date of Patent: Dec. 25, 2018

(54) INTEGRATED CIRCUIT DEVICE

(71) Applicant: Toshiba Memory Corporation, Minato-ku (JP)

(72) Inventors: Hiroki Okamoto, Nishinomiya (JP); Kiyoshi Okuyama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 70 days.

(21) Appl. No.: 15/258,201

(22) Filed: Sep. 7, 2016

(65) Prior Publication Data

US 2017/0271255 A1   Sep. 21, 2017

Related U.S. Application Data

(60) Provisional application No. 62/310,215, filed on Mar. 18, 2016.

(51) Int. Cl.
| | | |
|---|---|---|
| *H01L 23/528* | (2006.01) | |
| *H01L 27/11582* | (2017.01) | |
| *H01L 27/02* | (2006.01) | |
| *H01L 27/092* | (2006.01) | |
| *H01L 27/11565* | (2017.01) | |

(52) U.S. Cl.
CPC .... *H01L 27/11582* (2013.01); *H01L 27/0207* (2013.01); *H01L 27/092* (2013.01); *H01L 27/11565* (2013.01)

(58) Field of Classification Search
CPC ............................ H01L 23/528; H01L 27/1157
See application file for complete search history.

(56) References Cited

U.S. PATENT DOCUMENTS

| | | | |
|---|---|---|---|
| 5,732,009 A | 3/1998 | Tadaki et al. | |
| 6,271,548 B1 * | 8/2001 | Umemoto | H01L 27/11803 257/202 |
| 6,828,612 B2 | 12/2004 | Miyatake et al. | |
| 2010/0308417 A1 * | 12/2010 | Yokoyama | G11C 11/4125 257/390 |

FOREIGN PATENT DOCUMENTS

| | | |
|---|---|---|
| JP | 9-36325 | 2/1997 |
| JP | 2003-273245 | 9/2003 |
| JP | 3511267 | 3/2004 |

* cited by examiner

*Primary Examiner* — Marc Armand
(74) *Attorney, Agent, or Firm* — Oblon, McClelland, Maier & Neustadt, L.L.P.

(57) ABSTRACT

An integrated circuit device includes a first and a second semiconductor regions, a first electrode provided above the first semiconductor region, a second electrode provided above the second semiconductor region, a first and a second interconnects. The first and the second semiconductor regions are arranged to be separated from each other in a first direction. Longitudinal directions of the first and second semiconductor regions are a second direction. Longitudinal directions of the first and second electrode are a third direction. The first and second interconnects extend in the first direction and are provided in a region including a region directly above the first electrode and a region directly above the second electrode. The first interconnect is connected to the first electrode. The second interconnect is connected to the second electrode.

20 Claims, 11 Drawing Sheets though higher integration is necessary for elements that are disposed to correspond to the memory cells such as transistors included in sense amplifiers for example, to match the reduction of the arrangement period of the memory cells.

INTEGRATED CIRCUIT DEVICE

CROSS-REFERENCE TO RELATED APPLICATIONS

This application is based upon and claims the benefit of priority from U.S. Provisional Patent Application 62/310,215, filed on Mar. 18, 2016; the entire contents of which are incorporated herein by reference.

FIELD

Embodiments relate to an integrated circuit device.

BACKGROUND

In recent years, higher integration of memory cells in memory devices has been advancing. Accordingly, higher integration is necessary for elements that are disposed to correspond to the memory cells such as transistors included in sense amplifiers for example, to match the reduction of the arrangement period of the memory cells.

DETAILED DESCRIPTION

An integrated circuit device according to an embodiment includes a first semiconductor region, a second semiconductor region, a first electrode provided in a region directly above the first semiconductor region, a second electrode provided in a region directly above the second semiconductor region, a first interconnect and a second interconnect. The first semiconductor region and the second semiconductor region are arranged to be separated from each other in a first direction. A longitudinal direction of the first semiconductor region and a longitudinal direction of the second semiconductor region are a second direction intersecting the first direction. A longitudinal direction of the first electrode and a longitudinal direction of the second electrode are a third direction intersecting the first direction and the second direction. The first interconnect and the second interconnect extend in the first direction and are provided in a region including a region directly above the first electrode and a region directly above the second electrode. The first interconnect is connected to the first electrode. The second interconnect is connected to the second electrode.

(First Embodiment)

First, a first embodiment will be described.

Figure 1:
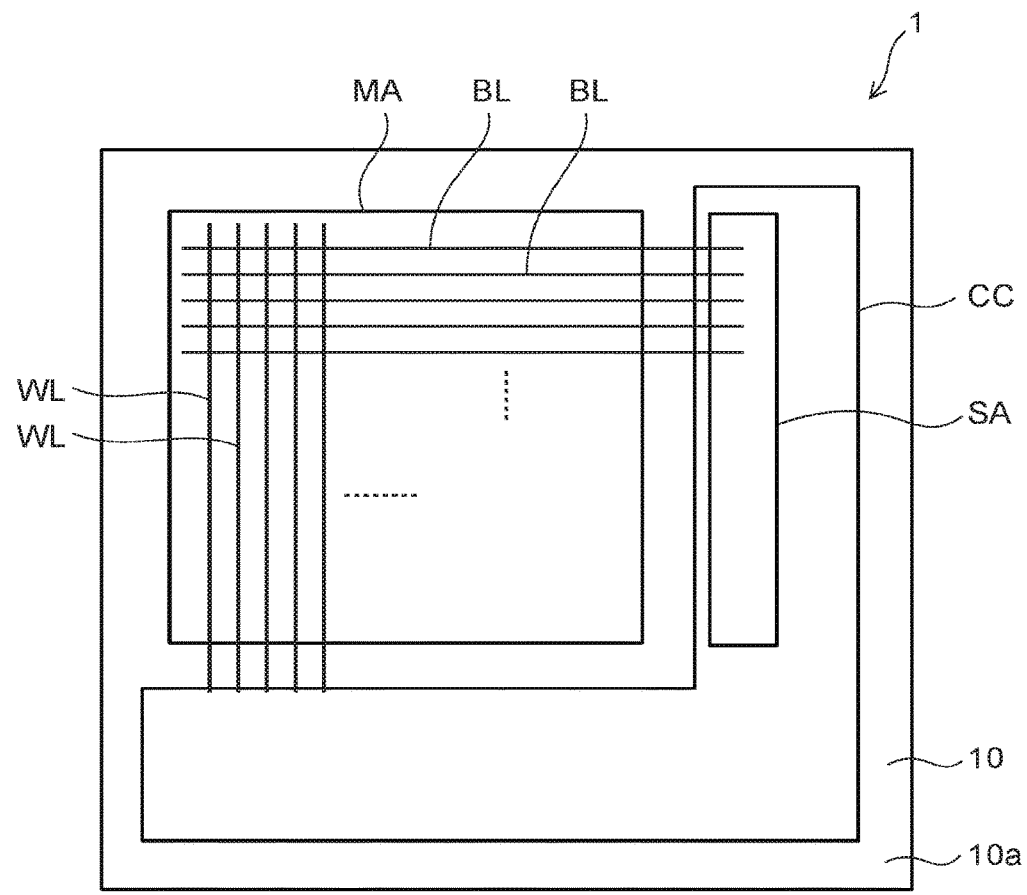
FIG. 1 is a block diagram showing an integrated circuit device according to a first embodiment.
Figure 1:
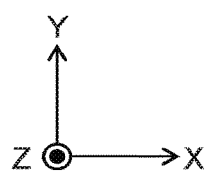

FIG. 1 is a block diagram showing an integrated circuit device according to the embodiment.

Figure 2:
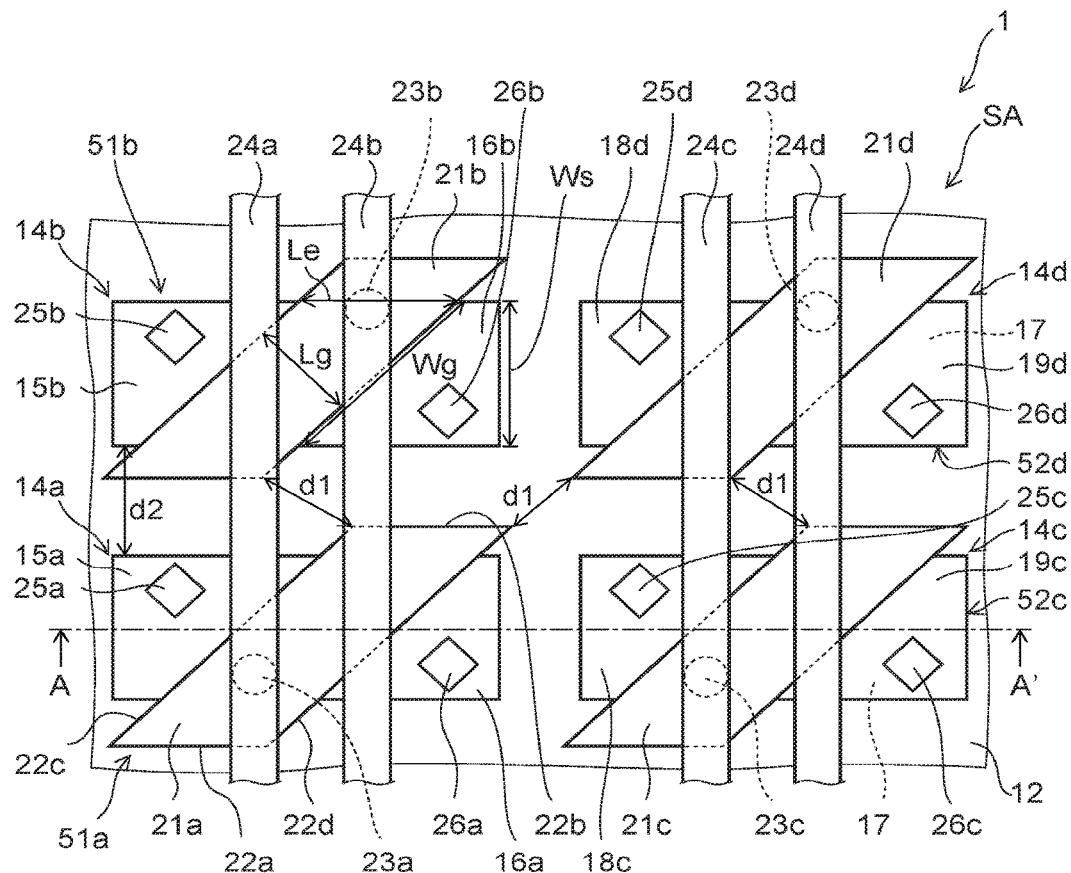
FIG. 2 is a plan view showing the integrated circuit device according to the first embodiment.
Figure 2:
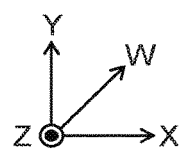

FIG. 2 is a plan view showing the integrated circuit device according to the embodiment.

Figure 3:
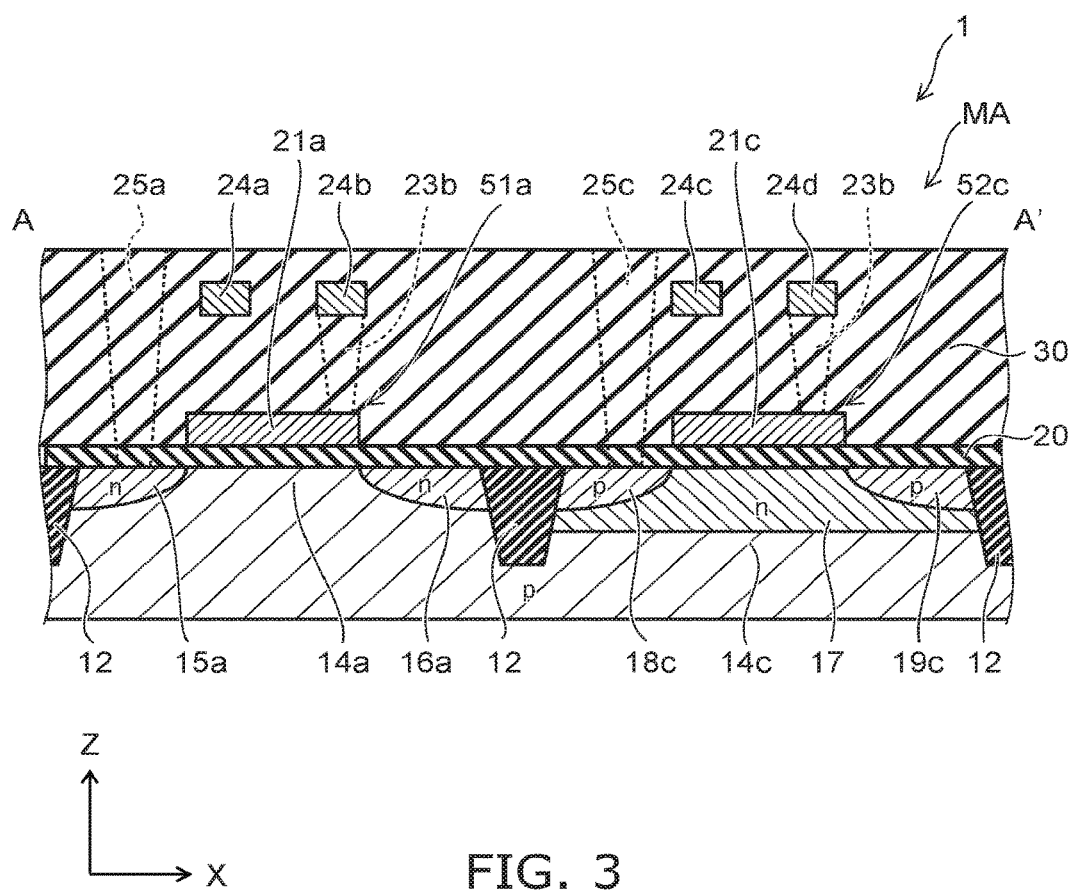
FIG. 3 is a cross-sectional view along line A-A' shown in FIG. 2.

FIG. 3 is a cross-sectional view along line A-A' shown in FIG. 2.

The integrated circuit device according to the embodiment is a stacked nonvolatile semiconductor memory device.

As shown in FIG. 1, a silicon substrate 10 is provided in the integrated circuit device 1 according to the embodiment. For example, the silicon substrate 10 is formed of a monocrystal of silicon. An upper surface 10a of the silicon substrate 10 is, for example, the (001) plane of silicon (Si).

In the specification hereinbelow, an XYZ orthogonal coordinate system is employed for convenience of description. Two mutually-orthogonal directions parallel to the upper surface 10a of the silicon substrate 10 are taken as an "X-direction" and a "Y-direction;" and a direction perpendicular to the upper surface 10a of the silicon substrate 10 is taken as a "Z-direction." Also, in the specification, although one of the Z-directions also is called "up" and the other of the Z-directions also is called "down," this notation also is for convenience and is independent of the direction of gravity.

A memory cell array MA and a control circuit CC are provided in the upper layer portion of the silicon substrate 10 and on the silicon substrate 10. The memory cell array MA is connected to the control circuit CC by an interconnect group including multiple word lines WL and multiple bit lines BL. Many memory cells are arranged three-dimensionally in the memory cell array MA; and each of the memory cells is connected to the word line WL and the bit line BL. The configuration example of the memory cell array MA is described in a sixth embodiment described below. The control circuit CC is a circuit that performs the programming, reading, erasing, etc., of data to and from the memory cells by applying a prescribed voltage to the memory cells via the word lines WL, the bit lines BL, etc. Sense amplifiers SA that sense the current flowing in the bit lines BL are provided in the control circuit CC.

As shown in FIG. 2, a STI (Shallow Trench Isolation) 12 is provided in a portion of the upper layer portion of the silicon substrate 10 in the sense amplifier SA. The upper layer portion of the silicon substrate 10 is partitioned into multiple semiconductor regions arranged in a matrix configuration along the X-direction and the Y-direction by the STI 12. Only four semiconductor regions 14a to 14d (hereinbelow, also generally called the "semiconductor region 14") that are arranged in two rows and two columns are shown in FIG. 2. When viewed from the semiconductor region 14a, the semiconductor region 14b is positioned in the Y-direction; and the semiconductor region 14c is positioned in the X-direction. Also, the semiconductor region 14d is positioned in the X-direction as viewed from the semiconductor region 14b and positioned in the Y-direction as viewed from the semiconductor region 14c. The configurations of the semiconductor regions 14a to 14d are substantially the same and are rectangles having the X-direction as the longitudinal directions as viewed from the Z-direction.

Gate electrodes 21a to 21d (hereinbelow, also generally called the "gate electrode 21") are provided respectively in the regions directly above the semiconductor regions 14a to 14d. The configurations of the gate electrodes 21a to 21d are substantially the same and are, for example, parallelogram plate configurations as viewed from the Z-direction. When viewed from the Z-direction, opposite sides 22a and 22b of the gate electrode 21 extend in the X-direction. The other opposite sides 22c and 22d of the gate electrode 21 extend in a W-direction. The W-direction is a direction that is orthogonal to the Z-direction and intersects the X-direction and the Y-direction. The angle between the W-direction and the Y-direction is, for example, 40 to 50 degrees, e.g., 45 degrees. The opposite sides 22c and 22d are longer than the opposite sides 22a and 22b.

In the specification, the "longitudinal direction of the gate electrode" refers to the direction in which the end edge of the gate electrode 21 crossing the semiconductor region 14 extends as an entirety when viewed from the Z-direction. Accordingly, in the example shown in FIG. 2, when viewed from the Z-direction, because the opposite sides 22c and 22d of the gate electrode 21 cross the semiconductor region 14, the W-direction in which the opposite sides 22c and 22d extend is called the longitudinal direction of the gate electrode 21. For example, in the monocrystal of silicon included in the silicon substrate 10, the X-direction is [100], the Y-direction is [010], the Z-direction is [001], and the W-direction is [110].

Two gate interconnects 24a and 24b that extend in the Y-direction are provided in a region including the regions directly above the gate electrodes 21a and 21b. The gate interconnect 24a is connected to the gate electrode 21a via a contact 23a extending in the Z-direction. The gate interconnect 24b is connected to the gate electrode 21b via a contact 23b. Similarly, two gate interconnects 24c and 24d that extend in the Y-direction are provided in a region including the regions directly above the gate electrodes 21c and 21d. The gate interconnect 24c is connected to the gate electrode 21c via a contact 23c. The gate interconnect 24d is connected to the gate electrode 21d via a contact 23d.

As shown in FIG. 3, for example, the conductivity type of the silicon substrate 10 is a p-type. A gate insulating film 20 is provided between the silicon substrate 10 and the gate electrodes 21a to 21d. Also, an inter-layer insulating film 30 is provided on the gate insulating film 20. For example, the gate insulating film 20 and the inter-layer insulating film 30 are formed of silicon oxide. The gate electrodes 21a to 21d, the contacts 23a to 23d, and the gate interconnects 24a to 24d are disposed inside the inter-layer insulating film 30. The inter-layer insulating film 30 is not shown in FIG. 2. This is similar for similar plan views described below as well.

As shown in FIG. 2 and FIG. 3, a pair of n-type layers 15a and 16a is formed in regions of the semiconductor region 14a provided on two sides of the region directly under the gate electrode 21a. A contact 25a that extends in the Z-direction is provided in the region directly above the n-type layer 15a and is connected to the n-type layer 15a. A contact 26a that extends in the Z-direction is provided in the region directly above the n-type layer 16a and is connected to the n-type layer 16a.

This is similar for the semiconductor region 14b as well; and a pair of n-type layers 15b and 16b is formed in regions provided on two sides of the region directly under the gate electrode 21b. A contact 25b that extends in the Z-direction is provided in the region directly above the n-type layer 15b and is connected to the n-type layer 15b. A contact 26b that extends in the Z-direction is provided in the region directly above the n-type layer 16b and is connected to the n-type layer 16b.

Thereby, an n-channel MOSFET (Metal-Oxide-Semiconductor Field-Effect Transistor) is formed in each of the semiconductor regions 14a and 14b. The n-type layers 15a and 16a are used as the source/drain regions of the n-channel MOSFET (hereinbelow, called an "nMOS 51a") formed in the semiconductor region 14a. The n-type layers 15b and 16b are used as the source/drain regions of the n-channel MOSFET (an nMOS 51b) formed in the semiconductor region 14b. For example, the n-type layers 15a and 15b are connected to memory cells of the memory cell array MA via the bit lines BL (referring to FIG. 1).

An n-type well 17 is formed in the upper portion of the semiconductor region 14c; and a pair of p-type layers 18c and 19c is formed in a region of the n-type well 17 provided on two sides of the region directly under the gate electrode 21c. A contact 25c that extends in the Z-direction is provided in the region directly above the p-type layer 18c and is connected to the p-type layer 18c. A contact 26c that extends in the Z-direction is provided in the region directly above the p-type layer 19c and is connected to the p-type layer 19c.

This is similar for the semiconductor region 14d as well; the n-type well 17 is formed in the upper portion of the semiconductor region 14d; and a pair of p-type layers 18d and 19d is formed in a region of the n-type well 17 provided on two sides of the region directly under the gate electrode 21d. A contact 25d that extends in the Z-direction is provided in the region directly above the p-type layer 18d and is connected to the p-type layer 18d. A contact 26d that extends in the Z-direction is provided in the region directly above the p-type layer 19d and is connected to the p-type layer 19d.

Thereby, a p-channel MOSFET is formed in each of the semiconductor regions 14c and 14c. The p-type layers 18c and 19c are used as the source/drain regions of the p-channel MOSFET (hereinbelow, called a "pMOS 52c") formed in the semiconductor region 14c. The p-type layers 18d and 19d are used as the source/drain regions of the p-channel MOSFET (a pMOS 52d) formed in the semiconductor region 14d.

Effects of the embodiment will now be described.

In the integrated circuit device 1 according to the embodiment as shown in FIG. 2, the longitudinal direction of the gate electrode 21 is the W-direction that intersects the Y-direction and the X-direction which is the arrangement direction of the semiconductor region 14. Thereby, the most proximal portion of the gate electrode 21 arranged along the Y-direction can be shifted not only in the Y-direction but also in the X-direction. As a result, a distance d2 between the semiconductor regions 14 can be reduced while ensuring a distance d1 between the gate electrodes 21 at a prescribed value; and higher integration of the MOSFETs can be realized.

Also, in the embodiment, an effective gate width Wg of the gate electrode 21 is wider than a width Ws of the semiconductor region 14 because the W-direction which is the longitudinal direction of the gate electrode 21 is tilted with respect to the Y-direction which is the transverse direction of the semiconductor region 14. Thereby, even in the case where the width Ws of the semiconductor region 14 is reduced to realize higher integration of the MOSFETs, the reduction of the effective gate width Wg can be suppressed.

As a result, the decrease of the threshold voltage accompanying the reduction of the gate width is suppressed; and an OFF current $I_{off}$ that flows between the source/drain when the MOSFET is switched to the nonconducting state can be reduced. In other words, the leakage current of the MOSFET can be reduced.

Further, because the longitudinal direction of the gate electrode 21 (the W-direction) is tilted with respect to the transverse direction of the semiconductor region 14 (the Y-direction), an effective gate length Le is longer than an original gate length Lg for the two Y-direction end portions of the semiconductor region 14. As a result, the effects of the edge portion of the semiconductor region 14 are reduced.

Further, by setting the angle between the W-direction and the Y-direction to be 45 degrees, the direction in which the current flows between the source/drain can be a direction orthogonal to the W-direction. The direction is parallel to the (011) plane of the silicon crystal. Thereby, the mobility of the holes increases compared to the case where the direction in which the current flows is parallel to the (100) plane of the silicon crystal. As a result, an ON current $I_{on}$ that flows when the p-channel MOSFET is switched to the conducting state can be increased. In an example, the ON current $I_{on}$ is increased about 10 to 20%. This effect is a maximum when the angle between the W-direction and the Y-direction is 45 degrees; but constant effects can be obtained if this angle is 40 to 50 degrees.

Further, because the length in the X-direction of the gate electrode 21 is longer than the gate length Lg, even in the case where the two gate interconnects 24a and 24b pass through the region directly above the gate electrode 21a, the breakdown voltage between the two interconnects can be ensured. Thereby, the gate electrode 21a and the gate electrode 21b can be connected to the mutually-different gate interconnects 24a and 24b. As a result, mutually-different potentials can be applied to the gate electrodes 21a and 21b; and the nMOS 51a and the nMOS 51b can be driven independently from each other. Similarly, the pMOS 52c and the pMOS 52d can be driven independently from each other.

(First Comparative Example)

A first comparative example will now be described.

Figure 4:
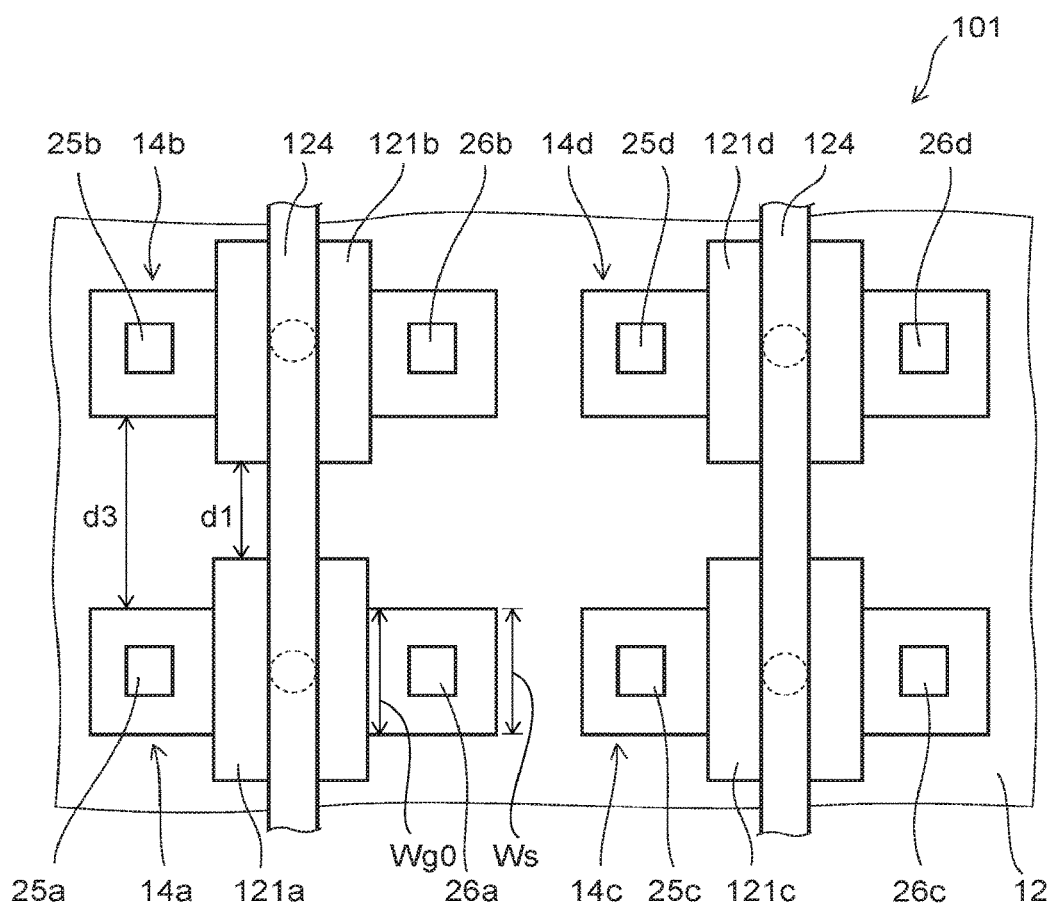
FIG. 4 is a plan view showing an integrated circuit device according to a first comparative example.

FIG. 4 is a plan view showing an integrated circuit device according to the comparative example.

In the integrated circuit device 101 according to the comparative example as shown in FIG. 4, the longitudinal directions of gate electrodes 121a to 121d (hereinbelow, generally called the "gate electrode 121") are the Y-direction. Therefore, if the distance d1 between the gate electrodes 121 is set to the same value as the distance d1 of the first embodiment (referring to FIG. 2), a distance d3 between the semiconductor regions 14 undesirably becomes longer than the distance d2 between the semiconductor regions 14 of the first embodiment (referring to FIG. 2). Thereby, higher integration of the MOSFETs is obstructed.

Also, because the longitudinal direction of the gate electrode 121 is the Y-direction, an effective gate width Ws0 of the MOSFET is equal to the width Ws of the semiconductor region 14. Accordingly, if the width Ws of the semiconductor region 14 is reduced, the gate width is undesirably reduced accordingly; and the OFF current $I_{off}$ undesirably increases.

Further, because the longitudinal direction of the gate electrode 121 is the Y-direction, the gate length is constant over the entire Y-direction region of the semiconductor region 14; and the effect of reducing the effects of the edge portion of the semiconductor region 14 is not obtained.

Further, in the comparative example, the direction in which the ON current flows in the MOSFET is the X-direction and is, for example, parallel to the (100) plane of the silicon crystal. Therefore, compared to the first embodiment described above, the mobility of the holes is low; and the ON current $I_{on}$ of the p-channel MOSFET is low.

Further, in the comparative example, compared to the first embodiment described above, because the length of the gate electrode 121 in the X-direction is short, it is difficult to provide two gate interconnects 124 in the region directly above the gate electrode 121. Therefore, the gate electrodes 121a and 121b are undesirably connected to the same gate interconnect 124; and mutually-different potentials cannot be applied.

(Second Embodiment)

A second embodiment will now be described.

Figure 5:
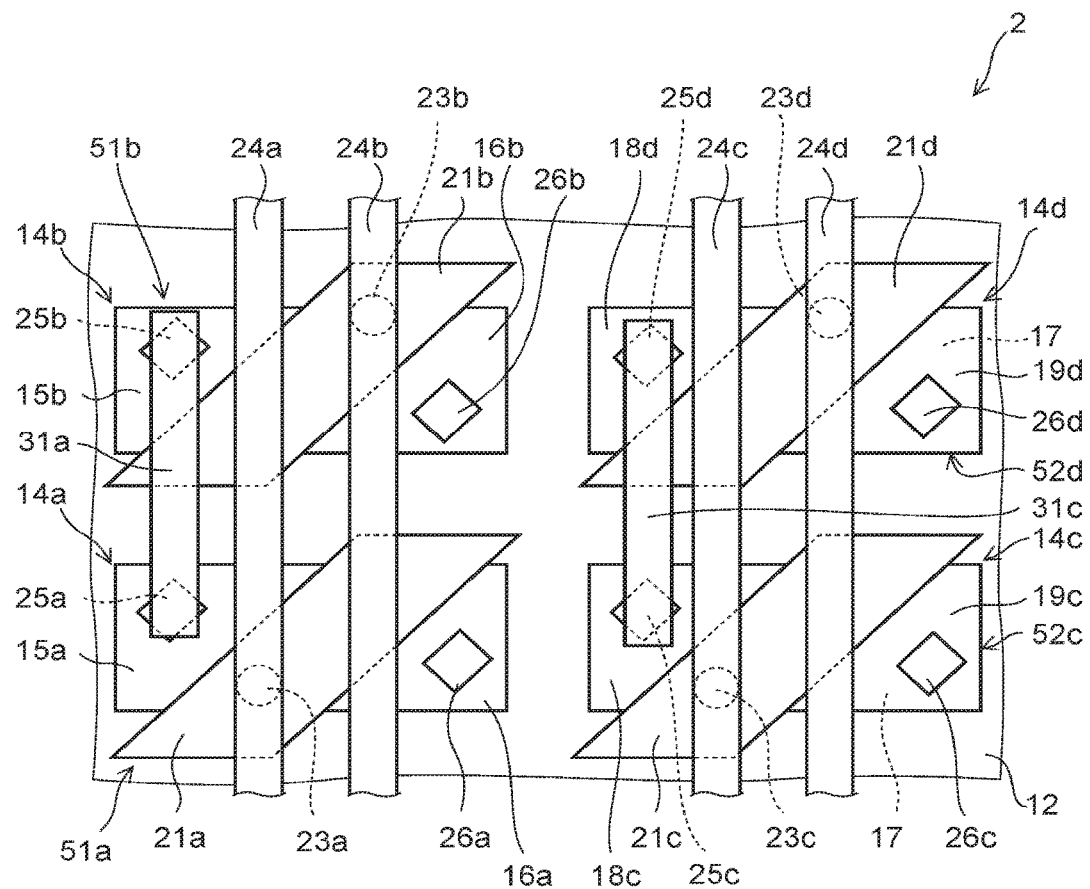
FIG. 5 is a plan view showing an integrated circuit device according to a second embodiment.

FIG. 5 is a plan view showing an integrated circuit device according to the embodiment.

In the integrated circuit device 2 according to the embodiment as shown in FIG. 5, S/D interconnects 31a and 31c that extend in the Y-direction are provided in addition to the configuration of the integrated circuit device 1 according to the first embodiment described above (referring to FIG. 1 and FIG. 2).

The S/D interconnect 31a straddles the gate electrode 21b and is connected to the upper end of the contact 25a and the upper end of the contact 25b. The lower end of the contact 25a is connected to the n-type layer 15a; and the lower end of the contact 25b is connected to the n-type layer 15b. Thereby, the S/D interconnect 31a connects the n-type layers 15a and 15b used as the source or drain of the nMOSs 51a and 51b to each other.

The S/D interconnect 31c straddles the gate electrode 21d and is connected to the upper end of the contact 25c and the upper end of the contact 25d. The lower end of the contact 25c is connected to the p-type layer 18c; and the lower end of the contact 25d is connected to the p-type layer 18d. Thereby, the S/D interconnect 31c connects p-type layers 18a and 18b used as the source or drain of the pMOSs 52c and 52d to each other.

In the integrated circuit device 2 according to the embodiment, because the gate electrodes 21a and 21b are electrically isolated from each other by the gate interconnects 24a and 24b, the nMOS 51a and the nMOS 51b can be driven independently even if the sources or drains of the nMOS 51a and the nMOS 51b are connected to each other. Also, because the gate electrodes 21c and 21d are electrically isolated from each other by the gate interconnects 24c and 24d, the pMOS 52c and the pMOS 52d can be driven independently even if the sources or drains of the pMOS 52c and the pMOS 52d are connected to each other. Thereby, the degrees of freedom of the driving of the nMOS 51a, the nMOS 51b, the pMOS 52c, and the pMOS 52d can be increased; and the interconnects of the periphery can be simplified.

Otherwise, the configuration and the effects of the embodiment are similar to those of the first embodiment described above.

(Third Embodiment)

A third embodiment will now be described.

Figure 6:
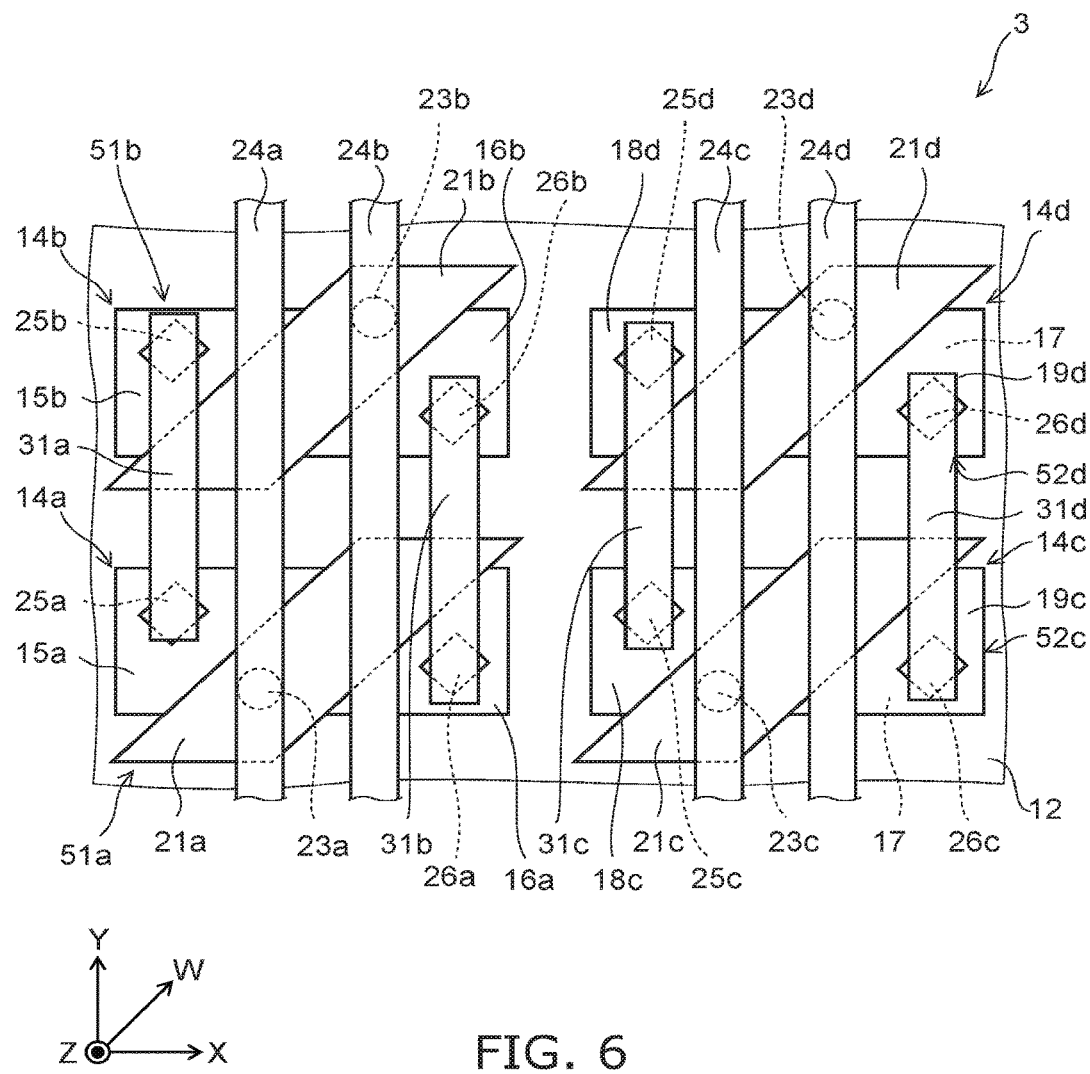
FIG. 6 is a plan view showing an integrated circuit device according to a third embodiment.

FIG. 6 is a plan view showing an integrated circuit device according to the embodiment.

In the integrated circuit device 3 according to the embodiment as shown in FIG. 6, S/D interconnects 31b and 31d that extend in the Y-direction are provided in addition to the configuration of the integrated circuit device 2 according to the second embodiment described above (referring to FIG. 5).

The S/D interconnect 31b straddles the gate electrode 21a and is connected to the upper end of the contact 26a and the upper end of the contact 26b. The lower end of the contact 26a is connected to the n-type layer 16a; and the lower end of the contact 26b is connected to the n-type layer 16b. Thereby, the S/D interconnect 31b connects the n-type layers 16a and 16b to each other.

The S/D interconnect 31d straddles the gate electrode 21c and is connected to the upper end of the contact 26c and the upper end of the contact 26d. The lower end of the contact 26c is connected to the p-type layer 19c; and the lower end of the contact 26d is connected to the p-type layer 19d. Thereby, the S/D interconnect 31d connects the p-type layers 19c and 19d to each other.

In the integrated circuit device 3 according to the embodiment, because the gate electrodes 21a and 21b are electrically isolated from each other by the gate interconnects 24a and 24b, the nMOS 51a and the nMOS 51b can be driven independently even if the sources of the nMOSs 51a and 51b are connected to each other and the drains of the nMOSs 51a and 51b are connected to each other. Also, because the gate electrodes 21c and 21d are electrically isolated from each other by the gate interconnects 24c and 24d, the pMOSs 52c and 52d can be driven independently even if the sources of the pMOSs 52c and 52d are connected to each other and the drains of the pMOSs 52c and 52d are connected to each other. Thereby, the degrees of freedom of the driving of the nMOS 51a, the nMOS 51b, the pMOS 52c, and the pMOS 52d can be increased; and the interconnects of the periphery can be simplified.

Otherwise, the configuration and the effects of the embodiment are similar to those of the third embodiment described above.

(Fourth Embodiment)

A fourth embodiment will now be described.

Figure 7:
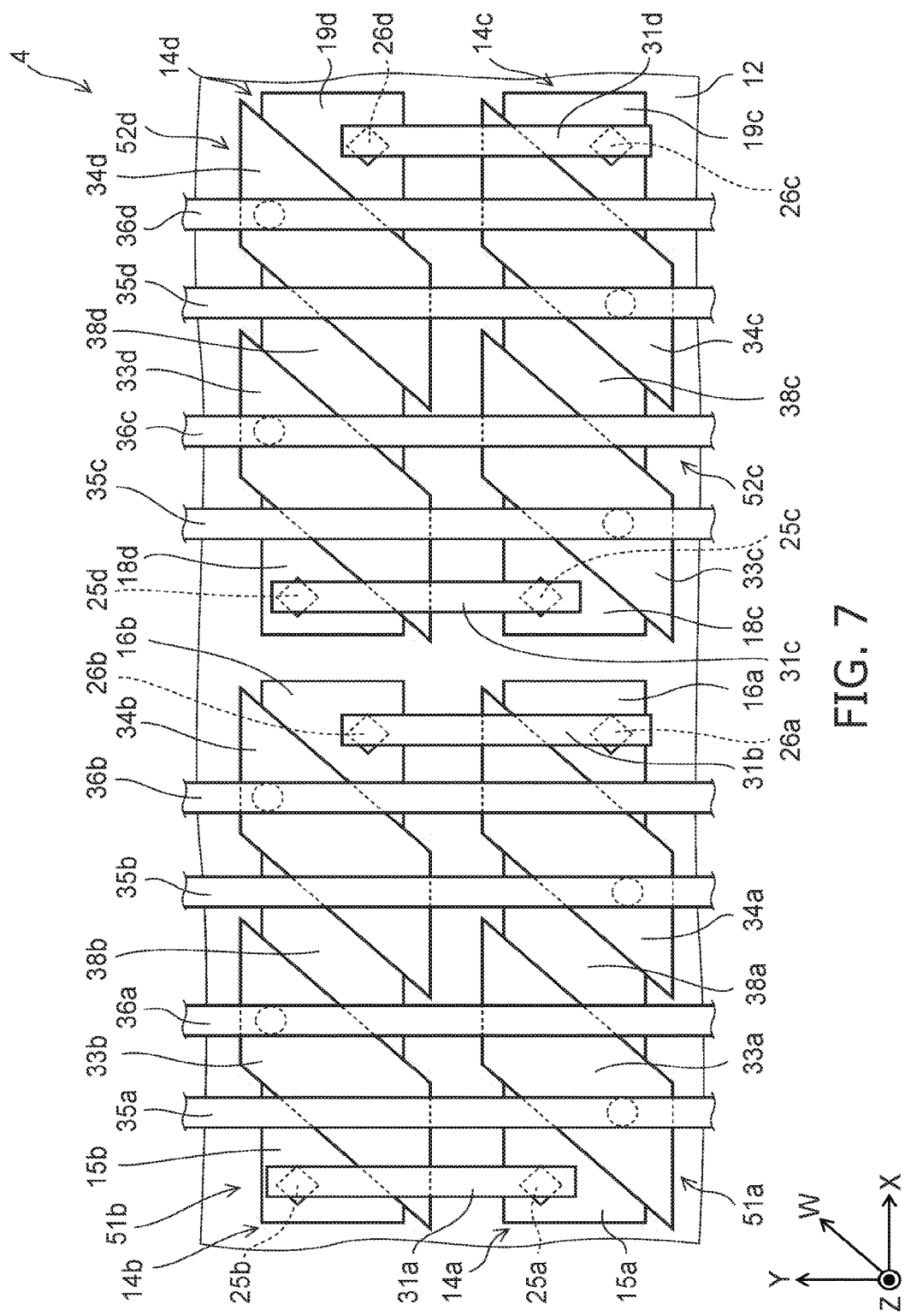
FIG. 7 is a plan view showing an integrated circuit device according to a fourth embodiment.

FIG. 7 is a plan view showing an integrated circuit device according to the embodiment.

As shown in FIG. 7, the integrated circuit device 4 according to the embodiment differs from the integrated circuit device 3 according to the third embodiment described above (referring to FIG. 6) in that the gate electrode 21 of each MOSFET is divided into two. Also, each gate interconnect 24 also is divided into two. Also, the portion of the semiconductor region 14 corresponding to the region between the divided gate electrodes is used as a resistance layer.

A specific description is as follows.

In the integrated circuit device 4 as shown in FIG. 7, gate electrodes 33a and 34a are provided instead of the gate electrode 21a shown in FIG. 6; gate electrodes 33b and 34b are provided instead of the gate electrode 21b shown in FIG. 6; gate electrodes 33c and 34c are provided instead of the gate electrode 21c shown in FIG. 6; and gate electrodes 33d and 34d are provided instead of the gate electrode 21d shown in FIG. 6.

Also, a gate interconnect 35a and a gate interconnect 36a are provided instead of the gate interconnect 24a. The gate interconnect 35a is connected to the gate electrode 33a; and the gate interconnect 36a is connected to the gate electrode 33b. Similarly, gate interconnects 35b and 36b are provided instead of the gate interconnect 24b and are connected respectively to the gate electrodes 34a and 34b. Gate interconnects 35c and 36c are provided instead of the gate interconnect 24c and are connected respectively to the gate electrodes 33c and 33d. Gate interconnects 35d and 36d are provided instead of the gate interconnect 24d and are connected respectively to the gate electrodes 34c and 34d.

A portion 38a of the semiconductor region 14a interposed between the region directly under the gate electrode 33a and the region directly under the gate electrode 34a functions as a resistance layer between the source/drain of the nMOS 51a. The conductivity type of the portion 38a is, for example, the n-type; and the carrier concentration of the portion 38a is not more than the carrier concentrations of the n-type layers 15a and 16a. This is similar for the semiconductor region 14b as well. A portion 38c of the semiconductor region 14c interposed between the region directly under the gate electrode 33c and the region directly under the gate electrode 34c functions as a resistance layer between the source/drain of the pMOS 52c. The conductivity type of the portion 38c is, for example, the p-type; and the carrier concentration of the portion 38c is not more than the carrier concentrations of the p-type layers 18c and 19c. This is similar for the semiconductor region 14d as well.

In the embodiment, for example, the nMOS 51a is switched to the conducting state when the ON potential is applied to both the gate electrodes 33a and 34a; and the nMOS 51a is switched to the nonconducting state when the OFF potential is applied to at least one of the gate electrode 33a or 34a. Thus, in the embodiment, it is possible to for the nMOS 51a to perform an AND operation. This is similar for the nMOS 51b, the pMOS 52c, and the pMOS 52d as well.

Otherwise, the configuration and the effects of the embodiment are similar to those of the third embodiment described above.

(Fifth Embodiment)

A fifth embodiment will now be described.

Figure 8:
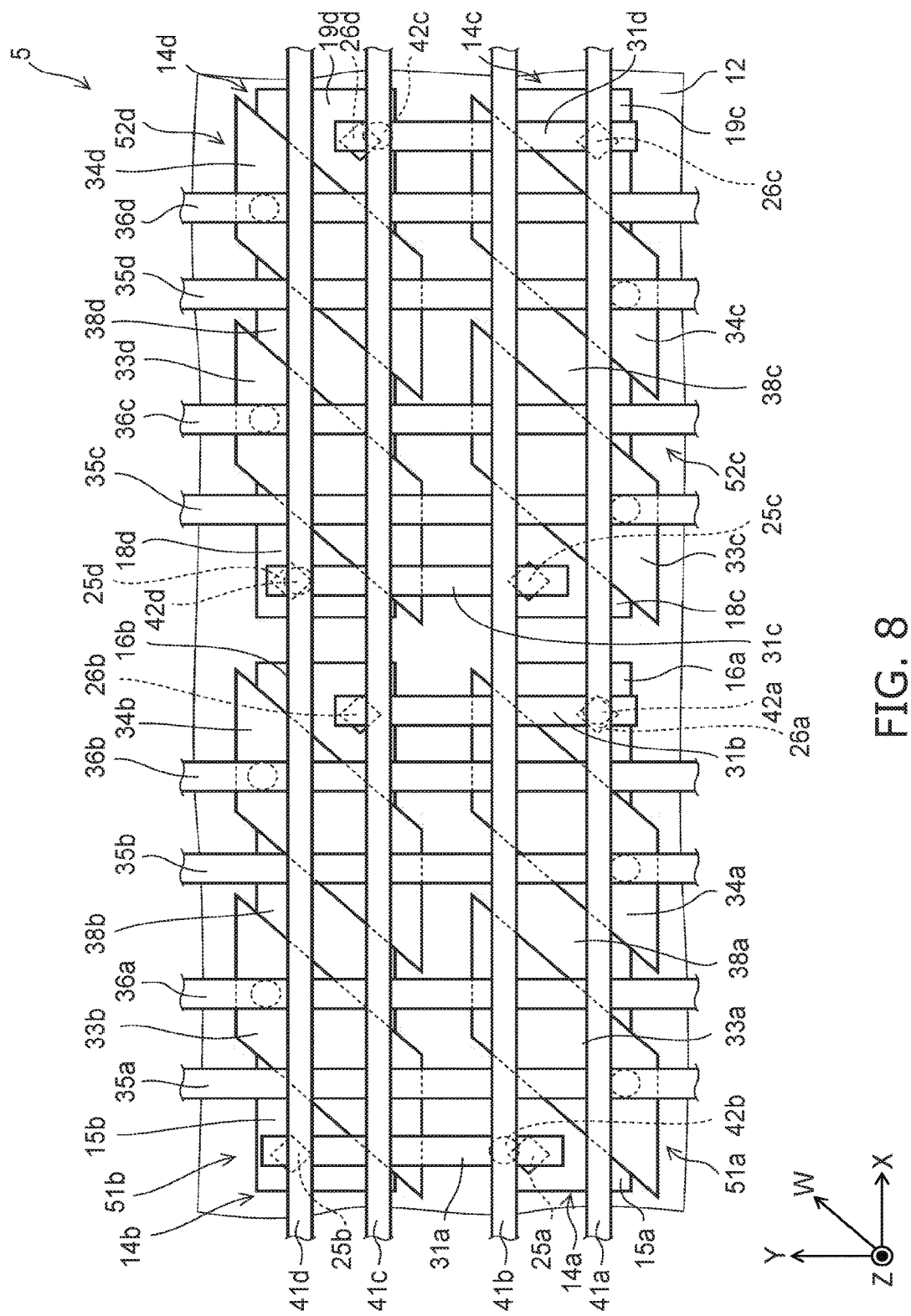
FIG. 8 is a plan view showing an integrated circuit device according to a fifth embodiment.

FIG. 8 is a plan view showing an integrated circuit device according to the embodiment.

In the integrated circuit device 5 according to the embodiment as shown in FIG. 8, upper layer interconnects 41a to 41d that extend in the X-direction are provided in addition to the configuration of the integrated circuit device 4 according to the fourth embodiment described above (referring to FIG. 7). The upper layer interconnects 41a to 41d are disposed above the gate interconnects 35a to 35d and 36a to 36d and the S/D interconnects 31a to 31d.

The upper layer interconnect 41a is connected to the S/D interconnect 31b by a via 42a. Thereby, the upper layer interconnect 41a is connected by the via 42a, the S/D interconnect 31b, and the contacts 26a and 26b to the n-type layers 16a and 16b, i.e., one of the source/drain of the nMOSs 51a and 51b.

The upper layer interconnect 41b is connected to the S/D interconnect 31a by a via 42b. Thereby, the upper layer interconnect 41b is connected by the via 42b, the S/D interconnect 31a, and the contacts 25a and 25b to the n-type layers 15a and 15b, i.e., the other of the source/drain of the nMOSs 51a and 51b.

The upper layer interconnect 41c is connected to the S/D interconnect 31d by a via 42c. Thereby, the upper layer interconnect 41c is connected by the via 42c, the S/D interconnect 31d, and the contacts 26c and 26d to the p-type layers 19c and 19d, i.e., one of the source/drain of the pMOSs 52c and 52d.

The upper layer interconnect 41d is connected to the S/D interconnect 31c by a via 42d. Thereby, the upper layer interconnect 41d is connected by the via 42d, the S/D interconnect 31d, and the contacts 25c and 25d to the p-type layers 18c and 18d, i.e., the other of the source/drain of the pMOSs 52c and 52d.

Effects of the embodiment will now be described.

As described in the first embodiment described above, because the gate potential of each MOSFET can be controlled independently in the integrated circuit device 5 according to the embodiment, these MOSFETs can be driven independently even if the source potential is used commonly between the nMOS 51a and the nMOS 51b, the drain potential is used commonly between the nMOS 51a and the nMOS 51b, the source potential is used commonly between the pMOS 52c and the pMOS 52d, and the drain potential is used commonly between the pMOS 52c and the pMOS 52d.

Accordingly, in the embodiment, it is sufficient to dispose the four upper layer interconnects 41a to 41d in the regions directly above the four semiconductor regions 14a to 14d arranged in the matrix configuration of two rows and two columns. Thereby, the arrangement period of the upper layer interconnects 41a to 41d is reduced; and higher integration of the integrated circuit device 5 can be realized.

(Second Comparative Example)

A second comparative example will now be described.

Figure 9:
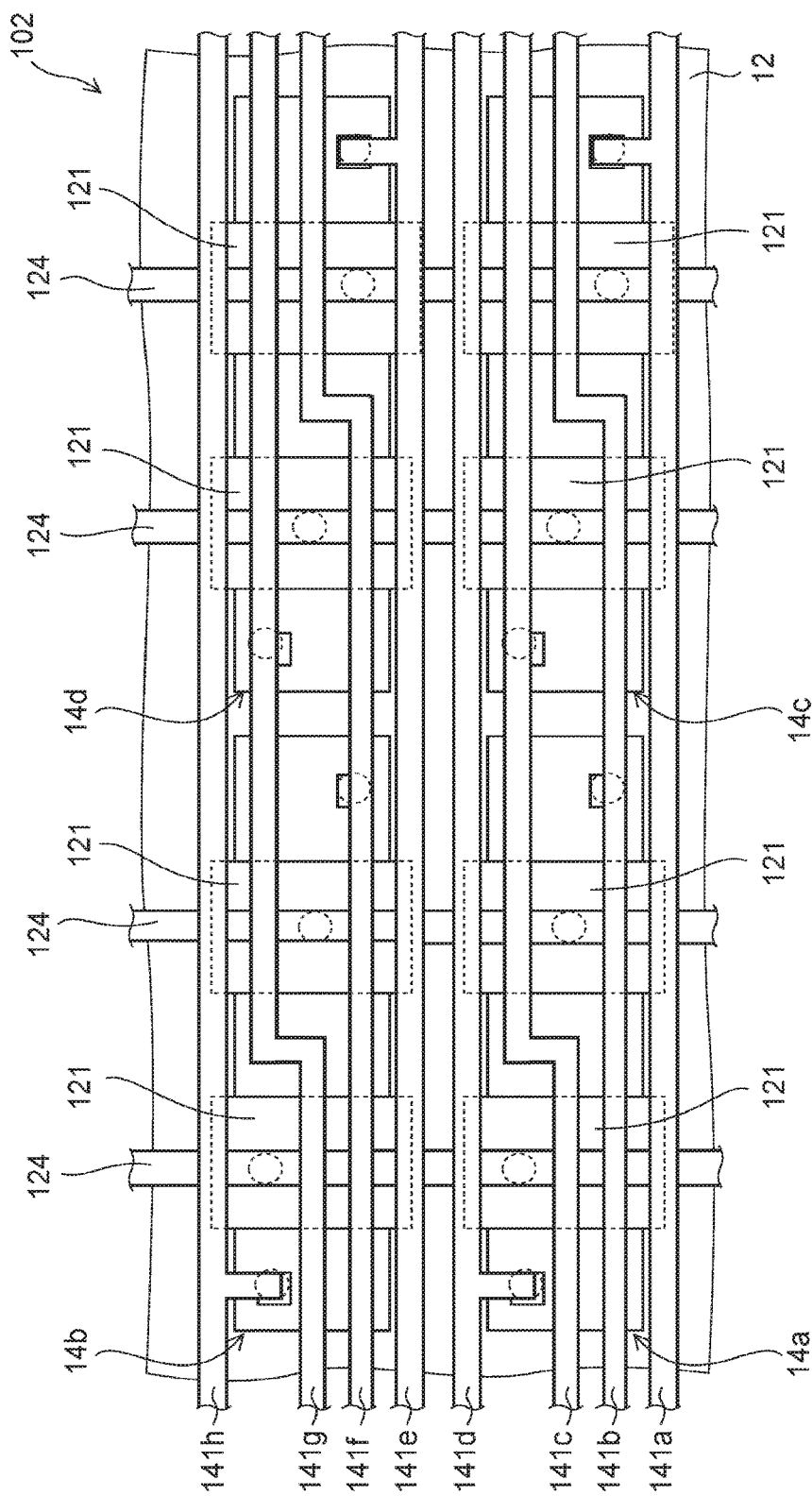
FIG. 9 is a plan view showing an integrated circuit device according to a second comparative example.

FIG. 9 is a plan view showing an integrated circuit device according to the comparative example.

In the integrated circuit device 102 according to the comparative example as shown in FIG. 9, compared to the integrated circuit device 101 according to the first comparative example described above (referring to FIG. 4), each gate electrode 121 is subdivided into two as in the fifth embodiment; and upper layer interconnects 141a to 141h that are connected to the source/drain of each MOSFET are provided.

In the integrated circuit device 102, mutually-different potentials cannot be applied because the gate electrodes 121 that are arranged in the Y-direction are connected to one gate interconnect 124. Therefore, a total of eight upper layer interconnects 141a to 141h are necessary to drive the four MOSFETs independently. However, because it is necessary for the upper layer interconnects 141b, 141c, 141f, and 141g to be bent to detour around the contacts, the space for ten upper layer interconnects is necessary. Therefore, in the integrated circuit device 102 according to the comparative example, higher integration in the Y-direction is difficult.

(Sixth Embodiment)

A sixth embodiment will now be described.

Figure 10:
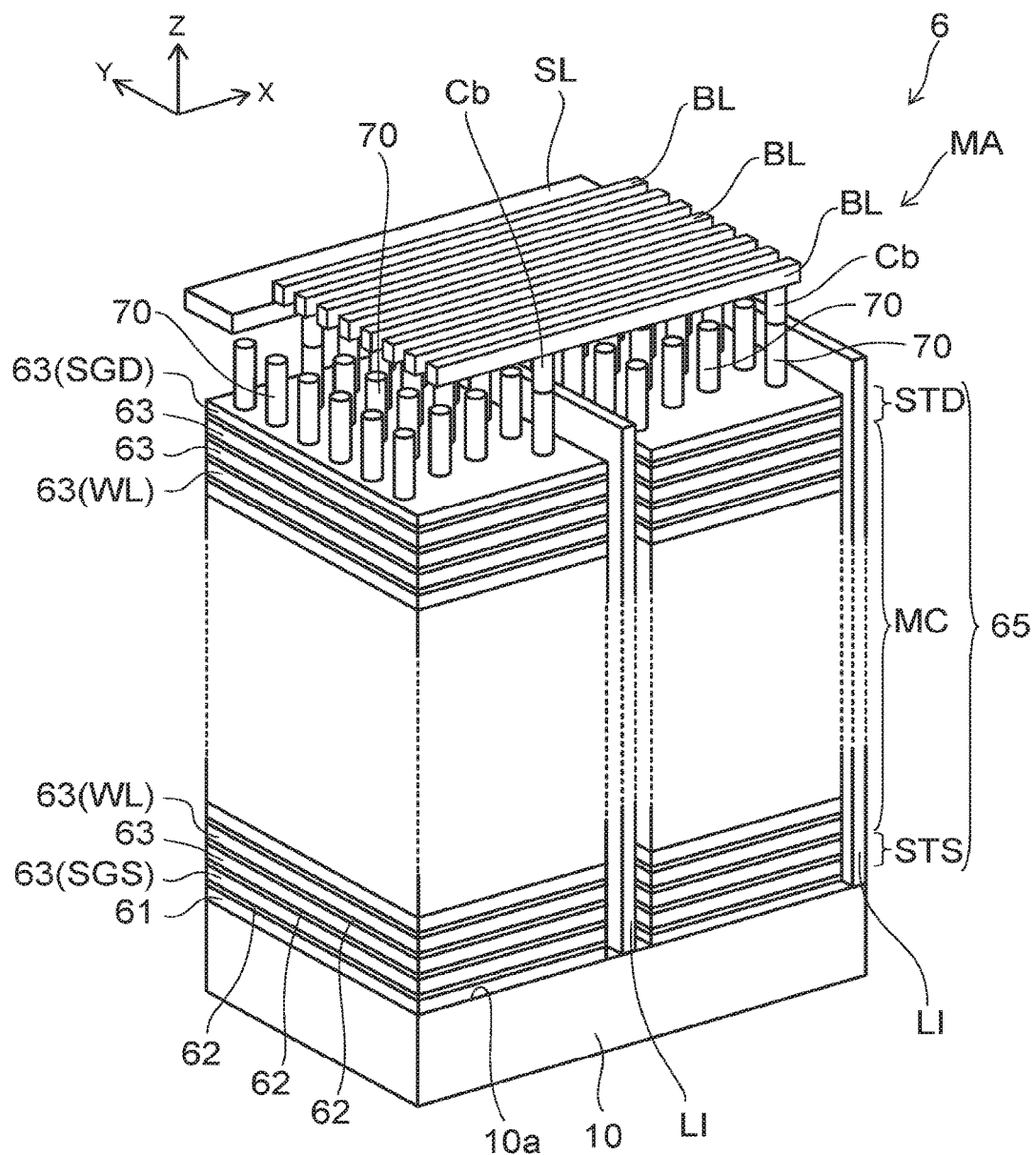
FIG. 10 is a perspective view showing a memory cell array of an integrated circuit device according to a sixth embodiment.

FIG. 10 is a perspective view showing a memory cell array of the integrated circuit device according to the embodiment.

Figure 11:
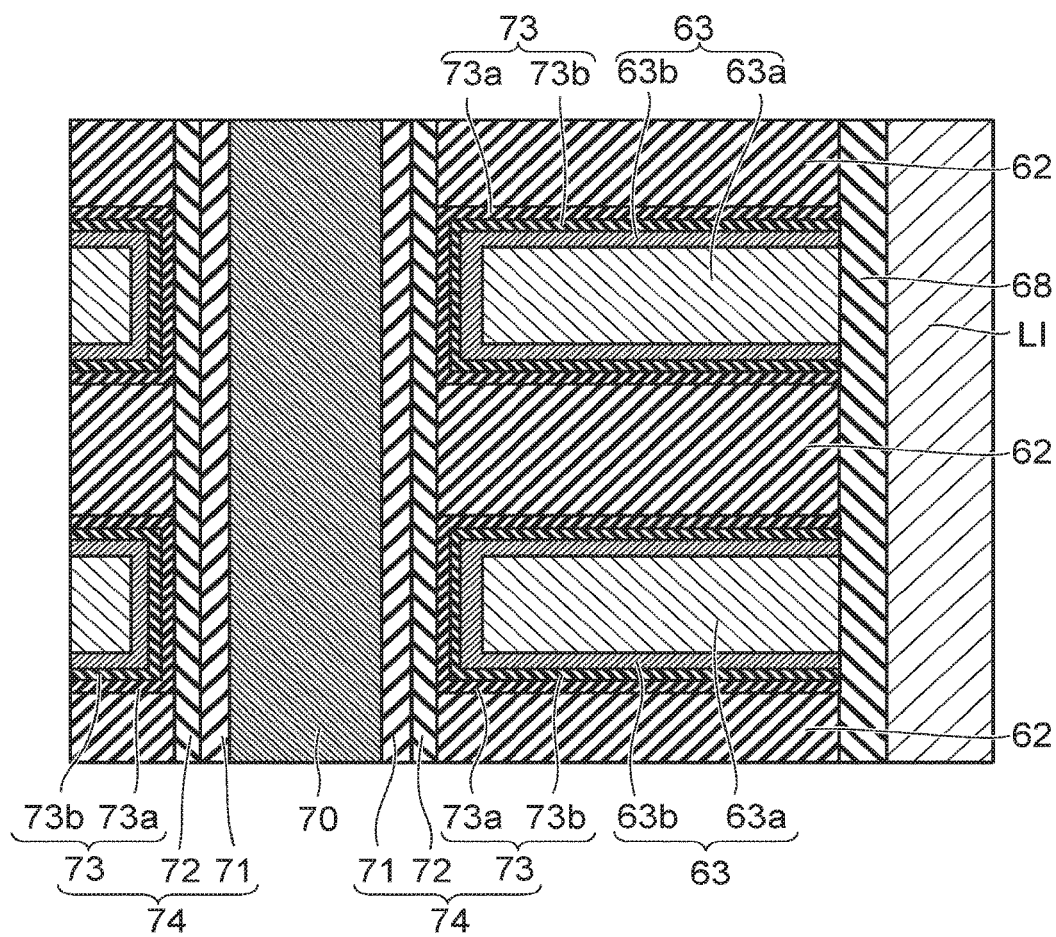
FIG. 11 is a cross-sectional view showing the memory cell array of the integrated circuit device according to the sixth embodiment.

FIG. 11 is a cross-sectional view showing the memory cell array of the integrated circuit device according to the embodiment.

The embodiment is an embodiment of a specific example of the memory cell array MA of the first to fifth embodiments described above (referring to FIG. 1).

In the memory cell array MA of the integrated circuit device 6 according to the embodiment as shown in FIG. 10, a silicon oxide film 61 is provided on the silicon substrate 10. Silicon oxide films 62 and electrode films 63 are stacked alternately along the Z-direction on the silicon oxide film 61. A stacked body 65 is formed of the silicon oxide film 61 and the multiple silicon oxide films 62 and the multiple electrode films 63 that are stacked alternately.

Multiple source electrode plates LI are provided inside the stacked body 65. The configuration of the source electrode plate LI is a plate configuration; the longest longitudinal direction of the source electrode plate LI is the Y-direction; the next longest width direction is the Z-direction; and the shortest thickness direction is the X-direction. The lower end of the source electrode plate LI is connected to the silicon substrate 10.

A silicon pillar 70 that extends in the Z-direction and pierces the stacked body 65 is provided inside the stacked body 65. The silicon pillar 70 is made of polysilicon; and the configuration of the silicon pillar 70 is a circular column or a circular tube having a plugged lower end portion. The lower end of the silicon pillar 70 is connected to the silicon substrate 10; and the upper end of the silicon pillar 70 is exposed at the upper surface of the stacked body 65. When viewed from the Z-direction, the silicon pillars 70 are arranged periodically along multiple columns, e.g., four columns. Each column extends in the Y-direction; and the positions of the silicon pillars 70 in the Y-direction are shifted one-half period between mutually-adjacent columns.

The multiple bit lines BL and a source line SL that extend in the X-direction are provided on the stacked body 65. The bit lines BL are provided higher than the source line SL. The source line SL is connected to the upper end of the source electrode plate LI via a source line contact (not shown). Also, the bit lines BL are connected to the upper ends of the silicon pillars 70 via bit line contacts Cb. Accordingly, the silicon pillars 70 are connected between the silicon substrate 10 and the bit lines BL.

In the stacked body 65, the electrode film 63 of one or multiple levels from the top functions as an upper selection gate line SGD; and an upper selection gate transistor STD is configured at each intersection between the upper selection gate line SGD and the silicon pillars 70. Also, the electrode film 63 of one or multiple levels from the bottom functions as a lower selection gate line SGS; and a lower selection gate transistor STS is configured at each intersection between the lower selection gate line SGS and the silicon pillars 70. The electrode films 63 other than the lower selection gate line SGS and the upper selection gate line SGD function as the word lines WL; and a memory cell transistor MC is configured at each intersection between the word lines WL and the silicon pillars 70. Thereby, a NAND string is formed by the multiple memory cell transistors MC being connected in series along each silicon pillar 70 and by the lower selection gate transistor STS and the upper selection gate transistor STD being connected by the two ends of the multiple memory cell transistors MC.

As shown in FIG. 11, a tunneling insulating film 71, a charge storage film 72, and a blocking insulating film 73 are provided between the silicon pillar 70 and the electrode films 63 in this order from the silicon pillar 70 toward the electrode film 63. A memory film 74 includes the tunneling insulating film 71, the charge storage film 72, and the blocking insulating film 73.

Although the tunneling insulating film 71 normally is insulative, the tunneling insulating film 71 is a film in which a tunneling current flows when a prescribed voltage within the range of the drive voltage output from the control circuit CC (referring to FIG. 1) is applied. The charge storage film 72 is a film that can store charge. The blocking insulating film 73 is a film in which a current substantially does not flow even when a voltage within the range of the drive voltage is applied.

The tunneling insulating film 71 and the charge storage film 72 are disposed on substantially the entire side surface of the silicon pillar 70; and the configurations of the tunneling insulating film 71 and the charge storage film 72 are circular tubes. The blocking insulating film 73 is provided on the upper surface of the electrode film 63, on the lower surface of the electrode film 63, and on the side surface of the electrode film 63 opposing the silicon pillar 70. A silicon oxide layer 73a and an aluminum oxide layer 73b are provided in the blocking insulating film 73. The silicon oxide layer 73a contacts the charge storage film 72 and the silicon oxide film 62; and the aluminum oxide layer 73b contacts the electrode film 63.

In the electrode film 63, for example, a main body unit 63a made of tungsten is provided; and a barrier metal layer 63b made of, for example, titanium nitride is provided on the upper surface of the main body unit 63a, on the lower surface of the main body unit 63a, and on the side surface of the main body unit 63a opposing the silicon pillar 70. A silicon oxide plate 68 is provided on the side surfaces of the source electrode plate LI facing the two X-direction sides.

On the other hand, the configuration of the sense amplifier SA of the control circuit CC of the integrated circuit device 6 according to the embodiment is as described in any of the first to fifth embodiments described above. For example, the bit lines BL shown in FIG. 10 are connected to the upper layer interconnects 41a to 41d shown in FIG. 8.

According to the embodiments described above, an integrated circuit device having high integration can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. An integrated circuit device, comprising:
   a first semiconductor region and a second semiconductor region arranged to be separated from each other in a first direction, a longitudinal direction of the first semiconductor region and a longitudinal direction of the second semiconductor region being a second direction intersecting the first direction;
   a first electrode provided in a region directly above the first semiconductor region, a longitudinal direction of the first electrode being a third direction intersecting the first direction and the second direction;
   a second electrode provided in a region directly above the second semiconductor region, a longitudinal direction of the second electrode being the third direction;
   a first interconnect extending in the first direction, being provided in a region including a region directly above the first electrode and a region directly above the second electrode, and being connected to the first electrode; and
   a second interconnect extending in the first direction, being provided in a region including a region directly above the first electrode and a region directly above the second electrode, and being connected to the second electrode.

2. The device according to claim 1, wherein an angle between the first direction and the third direction is 40 to 50 degrees.

3. The device according to claim 2, wherein the angle between the first direction and the third direction is 45 degrees.

4. The device according to claim 1, wherein the second direction is orthogonal to the first direction.

5. The device according to claim 1, wherein a portion of the first semiconductor region corresponding to a region directly under the first electrode is of a first conductivity type, and portions of the first semiconductor region provided on two sides of the directly-under region are of a second conductivity type.

6. The device according to claim 5, wherein the first conductivity type is an n-type, and the second conductivity type is a p-type.

7. The device according to claim 1, wherein the first semiconductor region and the second semiconductor region are formed in an upper layer portion of a semiconductor substrate.

8. The device according to claim 7, wherein the first direction, the second direction and the third direction are parallel to an upper surface of the semiconductor substrate.

9. The device according to claim 1, further comprising a third interconnect connected between a first portion of the first semiconductor region and a second portion of the second semiconductor region, the first portion being disposed on one side in the second direction of the first electrode, the second portion being disposed on the one side in the second direction of the second electrode.

10. The device according to claim 9, further comprising a fourth interconnect connected between a third portion of the first semiconductor region and a fourth portion of the second semiconductor region, the third portion being disposed on another side in the second direction of the first electrode, the fourth portion being disposed on the another side in the second direction of the second electrode.

11. The device according to claim 10, further comprising:
    a fifth interconnect extending in the second direction, being provided on the first to fourth interconnects, and being connected to the third interconnect; and
    a sixth interconnect extending in the second direction, being provided on the first to fourth interconnects, and being connected to the fourth interconnect.

12. The device according to claim 1, further comprising:
    a third electrode provided to be separated from the first electrode in the second direction in a region directly above the first semiconductor region, a longitudinal direction of the third electrode being the third direction;
    a fourth electrode provided to be separated from the second electrode in the second direction in a region directly above the second semiconductor region, a longitudinal direction of the fourth electrode being the third direction;
    a third interconnect extending in the first direction, being connected to the third electrode, and being provided in a region including a region directly above the first electrode and a region directly above the second electrode; and
    a fourth interconnect extending in the first direction, being connected to the fourth electrode, and being provided in a region including a region directly above the first electrode and a region directly above the second electrode.

13. The device according to claim 1, further comprising a memory cell array having memory cells integrated three-dimensionally.

14. An integrated circuit device, comprising:
    a first semiconductor region and a second semiconductor region arranged to be separated from each other in a first direction, a longitudinal direction of the first semiconductor region and a longitudinal direction of the second semiconductor region being a second direction intersecting the first direction;

a first electrode and a second electrode arranged to be separated from each other in the second direction, being provided in a region directly above the first semiconductor region, longitudinal directions of the first electrode and the second electrode being a third direction intersecting the first direction and the second direction;

a third electrode and a fourth electrode arranged to be separated from each other in the second direction, being provided in a region directly above the second semiconductor region, longitudinal directions of the third electrode and the fourth electrode being the third direction;

a first interconnect extending in the first direction, being provided in a region including a region directly above the first electrode and a region directly above the third electrode, and being connected to the first electrode;

a second interconnect extending in the first direction, being provided in a region including a region directly above the second electrode and a region directly above the fourth electrode, and being connected to the second electrode;

a third interconnect extending in the first direction, being provided in a region including a region directly above the first electrode and a region directly above the third electrode, and being connected to the third electrode; and a fourth interconnect extending in the first direction, being provided in a region including a region directly above the second electrode and a region directly above the fourth electrode, and being connected to the fourth electrode.

15. The device according to claim 14, further comprising:
a fifth interconnect connected between a first portion of the first semiconductor region and a second portion of the second semiconductor region; and
a sixth interconnect connected between a third portion of the first semiconductor region and a fourth portion of the second semiconductor region,
when projected onto a plane including the first direction and the second direction, the first portion and the third portion being provided on two sides of the first electrode and the second electrode, and the second portion and the fourth portion being provided on two sides of the third electrode and the fourth electrode.

16. The device according to claim 15, further comprising:
a seventh interconnect extending in the second direction, being provided on the first to sixth interconnects, and being connected to the fifth interconnect; and
an eighth interconnect extending in the second direction, being provided on the first to sixth interconnects, and being connected to the sixth interconnect.

17. The device according to claim 16, further comprising a memory cell array having memory cells integrated three-dimensionally,
the seventh interconnect and the eighth interconnect being connected to the memory cells.

18. The device according to claim 14, wherein an angle between the first direction and the third direction is 40 to 50 degrees.

19. An integrated circuit device, comprising:
a first semiconductor region and a second semiconductor region arranged to be separated from each other in a first direction, a longitudinal direction of the first semiconductor region and a longitudinal direction of the second semiconductor region being a second direction intersecting the first direction;

a third semiconductor region and a fourth semiconductor region arranged to be separated from each other in the first direction, a longitudinal direction of the third semiconductor region and a longitudinal direction of the fourth semiconductor region being the second direction, the third semiconductor region being positioned on the second-direction side of the first semiconductor region, the fourth semiconductor region being positioned on the second-direction side of the second semiconductor region;

a first electrode and a second electrode provided to be separated from each other in the second direction in regions directly above the first semiconductor region, longitudinal directions of the first electrode and the second electrode being a third direction intersecting the first direction and the second direction;

a third electrode and a fourth electrode provided to be separated from each other in the second direction in regions directly above the second semiconductor region, longitudinal directions of the third electrode and the fourth electrode being the third direction;

a fifth electrode and a sixth electrode provided to be separated from each other in the second direction in regions directly above the third semiconductor region, longitudinal directions of the fifth electrode and the sixth electrode being the third direction;

a seventh electrode and an eighth electrode provided to be separated from each other in the second direction in regions directly above the fourth semiconductor region, longitudinal directions of the seventh electrode and the eighth electrode being the third direction;

a first interconnect extending in the first direction, being connected to the first electrode, and being provided in a region including a region directly above the first electrode and a region directly above the third electrode;

a second interconnect extending in the first direction, being connected to the second electrode, and being provided in a region including a region directly above the second electrode and a region directly above the fourth electrode;

a third interconnect extending in the first direction, being connected to the third electrode, and being provided in a region including a region directly above the first electrode and a region directly above the third electrode;

a fourth interconnect extending in the first direction, being connected to the fourth electrode, and being provided in a region including a region directly above the second electrode and a region directly above the fourth electrode;

a fifth interconnect extending in the first direction, being connected to the fifth electrode, and being provided in a region including a region directly above the fifth electrode and a region directly above the seventh electrode;

a sixth interconnect extending in the first direction, being connected to the sixth electrode, and being provided in a region including a region directly above the sixth electrode and a region directly above the eighth electrode;

a seventh interconnect extending in the first direction, being connected to the seventh electrode, and being provided in a region including a region directly above the fifth electrode and a region directly above the seventh electrode;

an eighth interconnect extending in the first direction, being connected to the eighth electrode, and being provided in a region including a region directly above the sixth electrode and a region directly above the eighth electrode;
a ninth interconnect connected between a first portion of the first semiconductor region and a second portion of the second semiconductor region;
a tenth interconnect connected between a third portion of the first semiconductor region and a fourth portion of the second semiconductor region;
an eleventh interconnect connected between a fifth portion of the third semiconductor region and a sixth portion of the fourth semiconductor region;
a twelfth interconnect connected between a seventh portion of the third semiconductor region and an eighth portion of the fourth semiconductor region;
a thirteenth interconnect extending in the second direction, being provided on the first to twelfth interconnects, and being connected to the ninth interconnect;
a fourteenth interconnect extending in the second direction, being provided on the first to twelfth interconnects, and being connected to the tenth interconnect;
a fifteenth interconnect extending in the second direction, being provided on the first to twelfth interconnects, and being connected to the eleventh interconnect; and
a sixteenth interconnect extending in the second direction, being provided on the first to twelfth interconnects, and being connected to the twelfth interconnect,
when projected onto a plane including the first direction and the second direction, the first portion and the third portion being provided on two sides of the first electrode and the second electrode, the second portion and the fourth portion being provided on two sides of the third electrode and the fourth electrode, the fifth portion and the seventh portion being provided on two sides of the fifth electrode and the sixth electrode, and the sixth portion and the eighth portion being provided on two sides of the seventh electrode and the eighth electrode.

20. The device according to claim 19, further comprising:
a plurality of electrode films arranged to be separated from each other along a fourth direction, the fourth direction intersecting a plane including the first direction and the second direction;
a plurality of semiconductor members extending in the fourth direction and piercing the plurality of electrode films; and
a charge storage film provided between the semiconductor members and the electrode films,
the first semiconductor region, the second semiconductor region, the third semiconductor region and the fourth semiconductor region being formed in an upper layer portion of a semiconductor substrate, the plurality of electrode films being provided on the semiconductor substrate,
the thirteenth to sixteenth interconnects being connected respectively to the semiconductor members.

* * * * *